(12) United States Patent
Kezuka et al.

(10) Patent No.: US 7,052,627 B1
(45) Date of Patent: May 30, 2006

(54) ETCHING SOLUTION, ETCHED ARTICLE AND METHOD FOR ETCHED ARTICLE

(75) Inventors: Takehiko Kezuka, Settsu (JP); Makoto Suyama, Settsu (JP); Mitsushi Itano, Settsu (JP)

(73) Assignee: Daikin Industries, Ltd., Osaka (JP)

( * ) Notice: Subject to any disclaimer, the term of this patent is extended or adjusted under 35 U.S.C. 154(b) by 0 days.

(21) Appl. No.: 09/856,361

(22) PCT Filed: Nov. 22, 1999

(86) PCT No.: PCT/JP99/06503

§ 371 (c)(1),
(2), (4) Date: May 22, 2001

(87) PCT Pub. No.: WO00/31786

PCT Pub. Date: Jun. 2, 2000

(30) Foreign Application Priority Data

Nov. 24, 1998 (JP) .................................. 10-332767

(51) Int. Cl.
*C09K 13/00* (2006.01)
(52) U.S. Cl. .................. 252/79.1; 252/79.2; 252/79.3; 252/79.4
(58) Field of Classification Search .................. 216/90, 216/109, 99, 96; 252/79.1, 79.2, 79.3, 79.4; 134/1, 3; 438/756
See application file for complete search history.

(56) References Cited

U.S. PATENT DOCUMENTS

| | | | | |
|---|---|---|---|---|
| 5,277,835 A | * | 1/1994 | Ohmi et al. | 257/79.3 |
| 5,320,709 A | * | 6/1994 | Bowden et al. | 156/667 |
| 6,232,239 B1 | * | 5/2001 | Lim et al. | 438/745 |
| 6,254,796 B1 | * | 7/2001 | Rath et al. | 216/87 |
| 6,280,651 B1 | * | 8/2001 | Wojtczak et al. | 252/79.1 |
| 6,383,410 B1 | * | 5/2002 | Wojtczak et al. | 252/79.1 |

FOREIGN PATENT DOCUMENTS

| | | | |
|---|---|---|---|
| EP | 0 515 181 A2 | | 11/1992 |
| EP | 0 669 646 | | 2/1995 |
| EP | 0 669 646 | | 8/1995 |
| JP | 49-52799 | | 5/1974 |
| JP | 1974-052799 | | 5/1974 |
| JP | 52-56869 | | 5/1977 |
| JP | 58-204540 | | 11/1983 |
| JP | 1977-56869 | | 5/1997 |
| JP | 09-148301 | * | 6/1997 |
| JP | 11-60275 | | 3/1999 |
| JP | 11-74249 | | 3/1999 |
| JP | 1999-297656 | | 10/1999 |
| KR | 1992-22387 | | 12/1992 |
| KR | 1998-70026 | | 10/1998 |
| WO | WO 98/31768 | | 7/1998 |

* cited by examiner

*Primary Examiner*—George A. Goudreau
(74) *Attorney, Agent, or Firm*—Stites & Harbison PLLC; B. Aaron Schulman

(57) ABSTRACT

An etching solution which exhibits etching rates for both of a thermally oxidized film (THOX) and a boron-phosphorus-glass film (BPSG) of 100 Å/min or less at 25° C., and an etching rate ratio: etching rate for BPSG/etching rate for a thermally oxidized film (THOX) of 1.5 or less.

13 Claims, No Drawings

ETCHING SOLUTION, ETCHED ARTICLE AND METHOD FOR ETCHED ARTICLE

TECHNICAL FIELD

The present invention relates to an etching solution, a method for producing an etched article and an etched article produced by the method, more specifically, an etching solution and a method for producing an etched article for etching doped oxide films such as a boron phosphosilicate glass (BPSG) film and undoped oxide films such as a thermal oxide (THOX) film at the same etch rate or similar etch rate, and an etched article produced by the method.

BACKGROUND ART

Conventionally, as etchants for silicon wafers and the like have been used buffered hydrofluoric acids comprising HF (50-wt. % aqueous solution) and $NH_4F$ (40-wt. % aqueous solution) at such a ratio that can achieve a desired etch rate.

However, the buffered hydrofluoric acids etch doped oxide films such as BSG (boron silicate glass film), BPSG, PSG (phosphosilicate glass film), AsSg (phosphosilicate glass film) and the like faster than they etch undoped oxide films such as TEOS (oxide film formed by CVD method using tetraethoxysilane gas) and like USG, THOX and like. Therefore, the buffered hydrofluoric acids can not etch the doped oxide films and undoped oxide films at the same rate.

An object of the present invention is to provide an etching solution and an etching method for etching undoped oxide films such as TEOS, THOX and the like and oxide films doped with impurities at the same rate.

DISCLOSURE OF INVENTION

The present invention relates to the items 1–15 listed below.

Item 1. An etching solution having a thermal oxide (THOX) film etch rate and boron phosphosilicate glass (BPSG) film etch rate at 25° C. of 100 Å/min or lower and a ratio of (BPSG etch rate)/(THOX etch rate) of 1.5 or lower.

Item 2. The etching solution according to item 1 comprising at least one member selected from the group consisting of a fluoride salt and a bifluoride salt.

Item 3. The etching solution according to item 1, wherein a solvent of the etching solution has a relative dielectric constant of 35 or lower.

Item 4. The etching solution according to item 1 comprising at least one member selected from the group consisting of an organic acid and an organic solvent having a hetero atom.

Item 5. The etching solution according to item 1 comprising (i) ammonium hydrogenfluoride, (ii) water and (iii) at least one member selected from the group consisting of an organic acid and an organic solvent having a hetero atom, the water being contained in a concentration of 3% by weight or lower.

Item 6. The etching solution according to item 1 comprising ammonium hydrogenfluoride, water and isopropyl alcohol, the water being contained in a concentration of 3% by weight or lower.

Item 7. The etching solution according to item 1 comprising ammonium hydrogenfluoride, water and ethanol, the water being contained in a concentration of 3% by weight or lower.

Item 8. The etching solution according to item 1 comprising ammonium hydrogenfluoride, water and acetone, the water being contained in a concentration of 3% by weight or lower.

Item 9. The etching solution according to item 1 comprising (i) ammonium fluoride and (ii) at least one member selected from the group consisting of an organic acid and an organic solvent having a hetero atom.

Item 10. The etching solution according to item 1 comprising (i) ammonium fluoride, (ii) water and (iii) at least one member selected from the group consisting of an organic acid and an organic solvent having a hetero atom, the water being contained in a concentration of 10% by weight or lower.

Item 11. The etching solution according to item 1 comprising ammonium fluoride, water and ethanol, the water being contained in a concentration of 10% by weight or lower.

Item 12. The etching solution according to item 1 comprising ammonium fluoride, water and isopropyl alcohol, the water being contained in a concentration of 10% by weight or lower.

Item 13. The etching solution according to item 1 comprising ammonium fluoride, water and acetic acid, the water being contained in a concentration of 1.5% by weight or lower.

Item 14. A method for producing an etched article by etching an article with the etching solution as defined in any of items 1–13.

Item 15. An etched article which is produced by the method of item 14.

The etching solution of the present invention has the ratio of BPSG etch rate/THOX etch rate at 25° C. of 1.5 or lower, preferably 1.3 or lower, more preferably 1.2 or lower, still more preferably 1.1 or lower, particularly 1.05 or lower.

The BPSG is used for measuring etch rate after being formed as a film and annealed.

The etching solution of the present invention satisfies the above ratio of the etch rates, and also has a THOX etch rate and a BPSG etch rate at 25° C. of 100 Å/min or lower, preferably 80 Å/min or lower, still more preferably 60 Å/min or lower, particularly 50 Å/min or lower. The lower limit of the etch rates at 25° C. is 0.01 Å/min or higher, preferably 0.1 Å/min or higher, still more preferably 1 Å/min or higher.

The etch rate of the etching solution of the invention can be determined by etching BPSG and THOX with the etching solution at 25° C. and dividing the difference in the film thickness before and after being etched by the etch time.

Examples the fluoride salt and bifluoride salt of the present invention include metal salts, ammonium salts and quaternary ammonium salts. Preferable examples of the metal salts include those which have high solubility, such as potassium fluorides, sodium fluoride, potassium hydrogenfluoride, sodium hydrogenfluoride and the like. Examples of the ammonium salts include ammonium fluoride and ammonium hydrogenfluoride (ammonium hydrogenfluoride). Examples of the quaternary ammonium salts include tetramethylammonium fluoride, methylamine hydrofluoride, 2-hydroxyethyltrimethylammonium fluoride, tetramethylammonium hydrogenfluoride and the like.

In the present invention, the relative dielectric constant is that of the solvent (an organic solvent having a hetero atom, an organic acid or water) itself at 25° C.

The relative dielectric constant is 35 or lower, preferably 25 or lower, more preferably 21 or lower.

Ammonium hydrogenfluoride to be added to the etching solution of the invention may be in the form of crystals or an aqueous solution. Alternatively, a stoichiometric amount of ammonium fluoride and HF may be added to the etching solution to form ammonium hydrogenfluoride within the solution.

The ammonium fluoride to be added to the etching solution of the invention may be in the form of crystals or an aqueous solution.

Examples of the organic acid include acetic acid (relative dielectric constant: 6.15 (20° C.)), propionic acid (relative dielectric constant: 3.4 (40° C.)), butyric acid (relative dielectric constant: 2.97(20° C.)), isobutyric acid (relative dielectric constant: 2.73(40° C.)), valeric acid, caproic acid (relative dielectric constant: 2.63(71° C.)), caprylic acid (relative dielectric constant: 2.45(20° C.)), monochloroacetic acid (relative dielectric constant: 21 (20° C.)), dichloroacetic acid (relative dielectric constant: 8.08(20° C.)), trichloroacetic acid (relative dielectric constant: 4.6 (60° C.)), monofluoroacetic acid, difluoroacetic acid, trifluoroacetic acid, α-chlorobutyric acid, β-chlorobutyric acid, γ-chlorobutyric acid, lactic acid (relative dielectric constant: 22(70° C.)), glycolic acid, pyruvic acid, glyoxalic acid, acrylic acid and like monocarboxylic acids, methanesulfonic acid, toluenesulfonic acid and like sulfonic acids, oxalic acid, succinic acid, adipic acid, tartaric acid, citric acid and like polycarboxylic acids.

Examples of the organic solvent having a hetero atom include methanol (relative dielectric constant: 32.6 (25° C.)), ethanol (relative dielectric constant: 24.6 (25° C.)), isopropyl alcohol (IPA, relative dielectric constant: 19.9 (25° C.)), 1-propanol (relative dielectric constant: 22.2 (25° C.)), 1-butanol (relative dielectric constant: 17.1 (25° C.)), 2-butanol (relative dielectric constant: 15.5 (19° C.)), t-butanol (relative dielectric constant: 11.4 (19° C.)), 2-methyl-1-propanol (relative dielectric constant: 17.95 (20° C.)), 1-pentanol (relative dielectric constant: 13.9 (25° C.)), 1-hexanol (relative dielectric constant: 13.3 (25° C.)), 1-heptanol, 4-heptanol, 1-octanol (relative dielectric constant: 10.34 (20° C.)), 1-nonylalcohol, 1-decanol, 1-dodecanol and like alcohols; ethylene glycol (relative dielectric constant: 37.7 (25° C.)), 1,2-propanediol (relative dielectric constant: 32.0 (20° C.)), 2,3-butanediol, glycerin (relative dielectric constant: 42.5 (25° C.)) and like polyols, acetone (relative dielectric constant: 20.7 (25° C.)), acetylacetone, methyl ethyl ketone (relative dielectric constant: 18.51 (20° C.)) and like ketones; acetonitrile (relative dielectric constant: 37.5 (20° C.)), propionitrile (relative dielectric constant: 29.7 (20° C.)), butyronitrile (relative dielectric constant: 20.3 (20° C.)), isobutyronitrile (relative dielectric constant: 20.4 (20° C.)), benzonitrile (relative dielectric constant: 25.2 (25° C.)) and like nitriles; formaldehyde, acetaldehyde, propionaldehyde and like aldehydes; ethylene glycol monomethyl ether, ethylene glycol monoethyl ether and like alkylene glycol monoalkyl ethers; tetrahydrofuran (relative dielectric constant: 7.6 (25° C.)), dioxane (relative dielectric constant: 2.2 (25° C.)) and like ethers, trifluoroethanol, pentafluoropropanol, 2,2,3,3-tetrafluoropropanol and like fluorine alcohols, sulfolane (relative dielectric constant: 43.3 (30° C.)), nitromethane (relative dielectric constant: 35.87 (30° C.)) and the like.

The relative dielectric constant of water is 78.3 (25° C.).

The content of ammonium hydrogenfluoride is about 0.01–5% by weight, preferably about 0.01–2.5% by weight.

The content of ammonium fluoride is preferably about 0.01–4% by weight, more preferably about 0.01–2% by weight.

The water content is preferably 10% by weight or lower, more preferably about 3% by weight or lower.

The content of the organic acid is preferably 85% by weight or higher, more preferably 95% by weight or higher.

The content of the organic solvent having a hetero atom is preferably 85–99.9% by weight, more preferably 95–99.99% by weight.

The total content of the organic acid and the organic solvent having a hetero atom is preferably 85–99.9% by weight, more preferably 95–99.99% by weight.

Preferable etching solutions of the present invention and their compositions are shown below.

Ammonium hydrogenfluoride:IPA:water ~0.01–5% by weight: 92–99.99% by weight: 0–3% by weight;

Ammonium hydrogenfluoride:ethanol:water=0.01–5% by weight: 92–99.99% by weight: 0–3% by weight;

Ammonium hydrogenfluoride:acetone:water=0.01–5% by weight: 92–99.99% by weight: 0–3% by weight;

Ammonium fluoride:IPA:water=0.01–4% by weight 86–99.99% by weight: 0–10% by weight;

Ammonium fluoride:acetic acid:water=0.01–4% by weight: 94.5–99.99% by weight: 0–1.5% by weight;

Ammonium fluoride:ethanol:water=0.01–5% by weight: 86–99.99% by weight: 0–10% by weight.

The etching solution of the invention can be suitably used for etching oxide films of an article to be etched comprising an oxide film (BSG, BPSG, PSG, AsSG, etc.) doped with B, P, As and the like and an undoped oxide film such as USG such as THOX, TEOS and like.

In the etching method of the present invention, the temperature of the etching solution is about 15–40° C., and the etch time is about 0.25–10 minutes.

Examples of the article to be etched include single crystalline silicon wafers, gallium-arsenic wafers and like wafers, especially articles comprising a doped oxide film (BSG, BPSG, PSG, AsSG, etc.) and an undoped oxide film (THOX, TEOS and like USG).

The present invention can provide an etching solution and a method for producing an etched article for etching THOX, TEOS and like USG and a oxide film doped with impurities, such as BPSG, BSG and the like at nearly the same rate, and an etched article produced by the method.

BEST MODE FOR CARRYING OUT THE INVENTION

The present invention will be explained in more detail referring to Examples and Comparative Examples below.

Hereinafter, the relative dielectric constant is that of the solvent (an organic solvent having a hetero atom, an organic acid or water) itself at 25° C.

The etch rate was determined by measuring the thickness of the films before and after the etching using an Auto EL-III ellipsometer manufactured by Rudolf Research.

EXAMPLES 1–3 AND COMPARATIVE EXAMPLES 1–2

Ammonium hydrogenfluoride ($NH_4F \cdot HF$), water and an organic solvent having a hetero atom were mixed at the ratios shown in Table 1. The mixtures were filtrated using a filter paper to remove crystals therefrom, giving etching solutions. The etch rate and etch selectivity of the etching solutions were determined using two test substrates: one comprising a silicon substrate and a THOX film formed thereon, the other comprising a silicon substrate and a BPSG film formed thereon.

The results are shown in Table 1.

TABLE 1

Ammonium hydrogenfluoride/organic solvent/water etching solution

|   | Organic solvent | Relative dielectric constant | $NH_4F \cdot HF$ concentration (%) | Organic solvent concentration (%) | Water concentration (%) | THOX etch rate (Å/min). | BPSG etch rate (Å/min.) | Selectivity |
|---|---|---|---|---|---|---|---|---|
| Ex. 1 | IPA | 19.9 | 2.28 | 96.22 | 1.5 | 58 | 52 | 0.90 |
| Ex. 2 | Acetone | 20.7 | 2.28 | 96.22 | 1.5 | 16 | 18 | 1.13 |
| Ex. 3 | Ethanol | 24.6 | 2.28 | 96.22 | 1.5 | 31 | 37 | 1.19 |
| Comp. Ex. 1 | Ethanol | 32.7 | 2.28 | 96.22 | 1.5 | 63 | 120 | 1.90 |
| Comp. Ex. 2 | (Water) | 78.3 | 2.28 | 0 | 97.72 | 44 | 358 | 8.14 |

EXAMPLES 4–7 AND COMPARATIVE EXAMPLE 3

Ammonium fluoride ($NH_4F$), water and an organic solvent having a hetero atom were mixed at the ratios shown in Table 2. The mixtures were filtrated using a filter paper to remove crystals therefrom, giving etching solutions. The etch rate and selectivity of the etching solutions were determined using two test substrates: one comprising a silicon substrate and a THOX film formed thereon, the other comprising a silicon substrate and a BPSG film formed thereon. The results are shown in Table 2.

TABLE 2

Ammonium fluoride/organic solvent/water etching solution

|   | Organic solvent | Relative dielectric constant | $NH_4F \cdot HF$ concentration (%) | Organic solvent concentration (%) | Water concentration (%) | THOX etch rate (Å/min). | BPSG etch rate (Å/min.) | Selectivity |
|---|---|---|---|---|---|---|---|---|
| Ex. 4 | Acetic acid | 6.2 | 1.85 | 98.15 | 0 | 77 | 70 | 0.91 |
| Ex. 5 | IPA | 19.9 | 1.48 | 93.52 | 5.0 | 8 | 10 | 1.25 |
| Ex. 6 | Ethanol | 24.6 | 1.48 | 93.52 | 5.0 | 11 | 15 | 1.36 |
| Ex. 7 | Ethanol | 32.7 | 1.47 | 97.02 | 1.5 | 8 | 11 | 1.38 |
| Comp. Ex. 3 | (Water) | 78.3 | 1.48 | 0 | 98.52 | <3 | <3 | — |

EXAMPLE 8 AND COMPARATIVE EXAMPLES 4–7

Ammonium hydrogenfluoride ($NH_4F \cdot HF$), ammonium fluoride ($NH_4F$), water and an organic solvent having a hetero atom were mixed at the ratios shown in Table 3. The mixtures were filtrated using a filter paper to remove crystals therefrom, giving etching solutions. The etch rate and selectivity of the etching solutions were determined using two test substrates: one comprising a silicon substrate and a THOX film formed thereon, the other comprising a silicon substrate and a BPSG film formed thereon. The results are shown in Table 3.

TABLE 3

Ammonium hydrogenfluoride/ammonium fluoride/organic solvent/water etching solution

|   | Organic solvent | Relative dielectric constant | $NH_4F \cdot HF$ concentration (%) | $NH_4F$ concentration (%) | Organic solvent concentration (%) | Water concentration (%) | THOX etch rate (Å/min.) | BPSG etch rate (Å/min.) | Selectivity |
|---|---|---|---|---|---|---|---|---|---|
| Ex. 8 | Ethanol | 24.6 | 0.7125 | 1.48 | 92.81 | 5.0 | 28 | 35 | 1.25 |
| Comp. Ex. 4 | (Water) | 78.3 | 0.7125 | 9.5375 | 0 | 89.75 | 59 | 163 | 2.76 |

TABLE 3-continued

Ammonium hydrogenfluoride/ammonium fluoride/organic solvent/water etching solution

| | Organic solvent | Relative dielectric constant | NH$_4$F.HF concentration (%) | NH$_4$F concentration (%) | Organic solvent concentration (%) | Water concentration (%) | THOX etch rate (Å/min.) | BPSG etch rate (Å/min.) | Selectivity |
|---|---|---|---|---|---|---|---|---|---|
| Comp. Ex. 5 | (Water) | 78.3 | 0.7125 | 19.5375 | 0 | 79.75 | 63 | 153 | 2.43 |
| Comp. Ex. 6 | (Water) | 78.3 | 0.7125 | 29.5375 | 0 | 69.75 | 59 | 107 | 1.81 |
| Comp. Ex. 7 | (Water) | 78.3 | 0.7125 | 39.5375 | 0 | 59.75 | 43 | 66 | 1.53 |

EXAMPLES 9–13 AND COMPARATIVE EXAMPLE 8

Ammonium hydrogenfluoride (NH$_4$F.HF), water and IPA were mixed at the ratios shown in Table 4. The mixtures were filtrated using a filter paper to remove crystals therefrom, giving etching solutions. The etch rate and selectivity of the etching solutions were determined using two test substrates: one comprising a silicon substrate and a THOX film formed thereon, the other comprising a silicon substrate and a BPSG film formed thereon. The results are shown in Table 4.

TABLE 4

Ammonium hydrogenfluoride/2-propanol/organic solvent/water etching solution

| | Organic solvent | Relative dielectric constant | NH$_4$F.HF concentration (%) | Organic solvent concentration (%) | Water concentration (%) | THOX etch rate (Å/min). | BPSG etch rate (Å/min.) | Selectivity |
|---|---|---|---|---|---|---|---|---|
| Ex. 9 | IPA | 19.9 | 0.1425 | 98.8575 | 1.0 | 19 | 18 | 0.95 |
| Ex. 10 | IPA | 19.9 | 0.1425 | 98.3575 | 1.5 | 12 | 13 | 1.08 |
| Ex. 11 | IPA | 19.9 | 0.1425 | 97.8575 | 2.0 | 17 | 23 | 1.35 |
| Ex. 12 | IPA | 19.9 | 0.1425 | 97.3575 | 2.5 | 24 | 33 | 1.38 |
| Ex. 13 | IPA | 19.9 | 0.1425 | 96.8575 | 3.0 | 24 | 36 | 1.50 |
| Comp. Ex. 8 | IPA | 19.9 | 0.1425 | 94.3575 | 5.0 | 23 | 43 | 1.87 |

EXAMPLES 14–15 AND COMPARATIVE EXAMPLES 9–10

Ammonium fluoride (NH$_4$F), water and ethanol were mixed at the ratios shown in Table 5. The mixtures were filtrated using a filter paper to remove crystals therefrom, giving etching solutions. The etch rate and selectivity of the etching solutions were determined using two test substrates: one comprising a silicon substrate and a THOX film formed thereon, the other comprising a silicon substrate and a BPSG film formed thereon. The results are shown in Table 5.

TABLE 5

Ammonium fluoride/ethanol/water etching solution

| | Organic solvent | Relative dielectric constant | NH$_4$F concentration (%) | Organic solvent concentration (%) | Water concentration (%) | THOX etch rate (Å/min). | BPSG etch rate (Å/min.) | Selectivity |
|---|---|---|---|---|---|---|---|---|
| Ex. 14 | Ethanol | 24.6 | 1.48 | 97.02 | 1.5 | 8 | 10 | 1.25 |
| Ex. 15 | Ethanol | 24.6 | 1.48 | 88.52 | 10.0 | 13 | 18 | 1.38 |
| Comp. Ex. 9 | Ethanol | 24.6 | 1.48 | 83.52 | 15.0 | 12 | 29 | 2.42 |
| Comp. Ex. 10 | Ethanol | 24.6 | 1.48 | 68.52 | 30.0 | <3 | 27 | — |

EXAMPLES 16–19 AND COMPARATIVE EXAMPLES 11–12

Ammonium fluoride (NH$_4$F), water and acetic acid were mixed at the ratios shown in Table 6. The mixtures were filtrated using a filter paper to remove crystals therefrom, giving etching solutions. The etch rate and selectivity of the etching solutions were determined using two test substrates: one comprising a silicon substrate and a THOX film formed thereon, the other comprising a silicon substrate and a BPSG film formed thereon. The results are shown in Table 6.

TABLE 6

Ammonium fluoride/acetic acid/water etching solution

| | Organic solvent | Relative dielectric constant | NH$_4$F concentration (%) | Organic solvent concentration (%) | Water concentration (%) | THOX etch rate (Å/min). | BPSG etch rate (Å/min.) | Selectivity |
|---|---|---|---|---|---|---|---|---|
| Ex. 16 | Acetic acid | 6.2 | 0.2775 | 99.7225 | 0 | 27 | 38 | 1.41 |
| Ex. 17 | Acetic acid | 6.2 | 0.37 | 99.63 | 0 | 72 | 67 | 0.93 |
| Ex. 18 | Acetic acid | 6.2 | 0.37 | 96.3 | 1.0 | 73 | 95 | 1.31 |
| Ex. 19 | Acetic acid | 6.2 | 0.925 | 99.075 | 0 | 73 | 69 | 0.95 |
| Comp. Ex. 11 | Acetic acid | 6.2 | 3.7 | 96.3 | 0 | 104 | 101 | 0.97 |
| Comp. Ex. 12 | Acetic acid | 6.2 | 0.37 | 96.3 | 3.0 | 75 | 154 | 2.05 |

EXAMPLE 20 AND COMPARATIVE EXAMPLES 13–14

Ammonium hydrogenfluoride (NH$_4$F.HF), water and an organic solvent having a hetero atom were mixed at the ratios shown in Table 7. The mixtures were filtrated using a filter paper to remove crystals therefrom, giving etching solutions. The etch rate and selectivity of the etching solutions were determined using test substrates each comprising a silicon substrate and one of undoped oxide films (THOX, TEOS) and doped oxide films (BSG, BPSG, PSG, AsSG) formed thereon. The results are shown in Table 7.

TABLE 7

Etch rates of doped films and undoped films

| | Ex. 20 | Comp. Ex. 13 | Comp. Ex. 14 |
|---|---|---|---|
| Organic solvent | IPA | (Water) | (Water) |
| Relative dielectric constant | 19.9 | 78.3 | 78.3 |
| NH$_4$F.HF concentration (%) | 0.57 | 0.57 | 0.7125 |
| NH$_4$F concentration (%) | 0 | 0 | 39.5375 |
| Organic solvent concentration (%) | 98.675 | 0 | 0 |
| Water concentration (%) | 0.755 | 99.43 | 59.75 |
| Etch rate | | | |
| THOX etch rate (Å/min.) | 38 | 22 | 43 |
| TEOS etch rate (Å/min.) | 47 | 39 | 61 |
| BSG etch rate (Å/min.) | 48 | 171 | 93 |
| BPSG etch rate (Å/min.) | 39 | 179 | 66 |
| PSG etch rate (Å/min.) | 43 | 63 | 75 |
| AsSG etch rate (Å/min.) | 40 | 174 | 120 |
| Etch rate selectivity | | | |
| TEOS/THOX | 1.24 | 1.77 | 1.42 |
| BSG/THOX | 1.26 | 7.77 | 2.16 |
| BPSG/THOX | 1.03 | 8.14 | 1.53 |
| PSG/THOX | 1.13 | 2.86 | 1.74 |
| AsSG/THOX | 1.05 | 7.91 | 2.79 |

What is claimed is:

1. An etching solution having a thermal oxide (THOX) film etch rate and boron phosphosilicate glass (BPSG) film etch rate at 25° C. of 100 Å/min or lower and a ratio of (BPSG etch rate)/(THOX etch rate) of 1.5 or lower,
   wherein the solution comprises
   (i) at least one member selected from the group consisting of a fluoride salt and a hydrogen fluoride salt; and
   (ii) (a) solvent being at least one member selected from organic solvents and organic acids, or
   (b) solvent being at least one member selected from organic solvents and organic acids, and optionally water,
   said solvent comprising molecules having a hetero atom, and
   wherein said organic acids are selected from the group consisting of acetic acid, propionic acid, butyric acid, isobutyric acid, valeric acid, caproic acid, caprylic acid, monochloroacetic acid, dichloroacetic acid, trichloroacetic acid, monofluoroacetic acid, difluoroacetic acid, trifluoroacetic acid, a-chlorobutyric acid, β-chlorobutyric acid, γ-chlorobutyric acid, lactic acid, glycolic acid, pyruvic acid, glyoxalic acid, acrylic acid, and like monocarboxylic acids methanesulfonic acid and toluenesulfonic acid.

2. The etching solution according to claim 1 comprising at least one member selected from the group consisting of a fluoride salt and a bifluoride salt.

3. The etching solution according to claim 1, wherein a solvent of the etching solution has a relative dielectric constant of 35 or lower.

4. The etching solution according to claim 1 comprising (i) ammonium hydrogen fluoride, (ii) water and (iii) at least one member selected from the group consisting of an organic acid and an organic solvent comprising molecules having a hetero atom, the water being contained in a concentration of 3% by weight or lower.

5. The etching solution according to claim 1 comprising ammonium hydrogen fluoride, water and isopropyl alcohol, the water being contained in a concentration of 3% by weight or lower.

6. The etching solution according to claim 1 comprising ammonium hydrogen fluoride, water and ethanol, the water being contained in a concentration of 3% by weight or lower.

7. The etching solution according to claim 1 comprising ammonium hydrogen fluoride, water and acetone, the water being contained in a concentration of 3% by weight or lower.

8. The etching solution according to claim 1 comprising (i) ammonium fluoride and (ii) at least one member selected from the group consisting of an organic acid and an organic solvent comprising molecules having a hetero atom.

9. The etching solution according to claim 1 comprising (i) ammonium fluoride, (ii) water and (iii) at least one member selected from the group consisting of an organic acid and an organic solvent comprising molecules having a hetero atom, the water being contained in a concentration of 10% by weight or lower.

10. The etching solution according to claim 1 comprising ammonium fluoride, water and ethanol, the water being contained in a concentration of 10% by weight or lower.

11. The etching solution according to claim 1 comprising ammonium fluoride, water and isopropyl alcohol, the water being contained in a concentration of 10% by weight or lower.

12. The etching solution according to claim 1 comprising ammonium fluoride, water and acetic acid, the water being contained in a concentration of 1.5% by weight or lower.

13. An etching solution having a thermal oxide (THOX) film etch rate and boron phosphosilicate glass (BPSG) film etch rate at 25° C. of 100 Å/min or lower and a ratio of (BPSG etch rate)/(THOX etch rate) of 1.5 or lower, said etching solution comprising ammonium fluoride, water and acetic acid, the water being contained in a concentration of 1.5% by weight or lower.

* * * * *